(12) United States Patent
Takezawa et al.

(10) Patent No.: US 12,740,349 B2
(45) Date of Patent: Sep. 15, 2026

(54) FILM FORMING METHOD AND FILM FORMING APPARATUS

(71) Applicant: Tokyo Electron Limited, Tokyo (JP)

(72) Inventors: Yoshihiro Takezawa, Yamanashi (JP); Toru Kanazawa, Yamanashi (JP); Yosuke Watanabe, Yamanashi (JP); Tatsuya Miyahara, Yamanashi (JP); Yuki Tanabe, Yamanashi (JP); Daisuke Suzuki, Yamanashi (JP); Masahisa Watanabe, Yamanashi (JP); Keisuke Suzuki, Yamanashi (JP); Tuhin Shuvra Basu, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 389 days.

(21) Appl. No.: 18/481,492

(22) Filed: Oct. 5, 2023

(65) Prior Publication Data

US 2024/0128081 A1 Apr. 18, 2024

(30) Foreign Application Priority Data

Oct. 13, 2022 (JP) ................................ 2022-164943
Aug. 24, 2023 (JP) ................................ 2023-135969

(51) Int. Cl.
*H10P 14/20* (2026.01)
*C23C 16/24* (2006.01)

(52) U.S. Cl.
CPC .......... *H10P 14/3806* (2026.01); *C23C 16/24* (2013.01); *H10P 14/3411* (2026.01); *H10P 14/3454* (2026.01)

(58) Field of Classification Search
CPC ....................... H10D 30/6745; H10D 86/0225
See application file for complete search history.

(56) References Cited

FOREIGN PATENT DOCUMENTS

JP 2011-060908 3/2011
JP 2011060908 A * 3/2011

* cited by examiner

*Primary Examiner* — Edward Chin
(74) *Attorney, Agent, or Firm* — IPUSA, PLLC

(57) ABSTRACT

A film forming method includes preparing a substrate having an amorphous silicon film on a surface thereof, diffusing nickel into the amorphous silicon film by supplying a nickel source gas to the amorphous silicon film, and forming a polycrystalline silicon film by heating the amorphous silicon film, and crystallizing the amorphous silicon film by metal-induced lateral crystallization using the nickel diffused in the amorphous silicon film as a nucleus.

12 Claims, 13 Drawing Sheets

FIG.5

| | Condition 1A | Condition 1B | Condition 1C |
|---|---|---|---|
| Crystal Grain Map | | | |
| Arithmetic average of grain diameter [$\mu$ m] | 1.23 | 1.07 | 0.66 |
| Weighted average of grain diameter [$\mu$ m] | 6.80 | 2.26 | 0.76 |
| Ni Concentration [atoms/cm$^2$] | 4.7E+12 | 1.3E+14 | – |

TEYmode
Reference
NiO
Ni
$NiSi_2$
X-Ray Absorption [a. u.]
X-Ray Energy [eV]
850
855
860
865

FILM FORMING METHOD AND FILM FORMING APPARATUS

CROSS-REFERENCE TO RELATED APPLICATIONS

This application is based upon and claims priority to Japanese Patent Applications No. 2022-164943 filed on Oct. 13, 2022, and No. 2023-135969 filed on Aug. 24, 2023, the entire contents of which are incorporated herein by reference.

BACKGROUND

1. Field of the Invention

The present disclosure relates to film forming methods and film forming apparatuses.

2. Description of the Related Art

There is a known technique which causes nickel particles to be adsorbed on a surface of an amorphous silicon film, and then performs an annealing to modify the amorphous silicon film into a polycrystalline silicon film. An example of such a known technique is proposed in Japanese Laid-Open Patent Publication No. 2011-60908, for example.

SUMMARY

A film forming method according to one aspect of the present disclosure includes preparing a substrate having an amorphous silicon film on a surface thereof; diffusing nickel into the amorphous silicon film by supplying a nickel source gas to the amorphous silicon film; and forming a polycrystalline silicon film by heating the amorphous silicon film, and crystallizing the amorphous silicon film by metal-induced lateral crystallization using the nickel diffused in the amorphous silicon film as a nucleus.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF THE DRAWINGS

FIG. 5 is a diagram comparing crystal grain maps of polycrystalline silicon films;

DETAILED DESCRIPTION

Figure 1A:
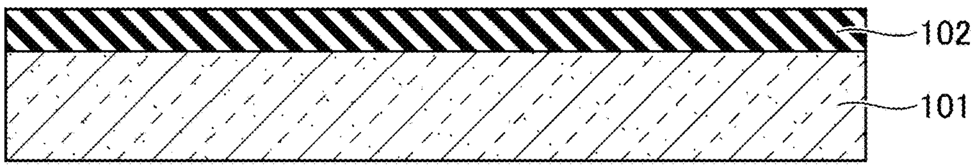
FIG. 1A, FIG. 1B, FIG. 1C, and FIG. 1D are cross sectional views illustrating a film forming method according to an embodiment.

Non-limiting embodiments of the present disclosure will now be described with reference to the accompanying drawings. In all of the accompanying drawings, the same or corresponding members or components are designated by the same or corresponding reference numerals, and a redundant description thereof will be omitted.

The present disclosure provides a technique capable of reducing agglomeration of nickel silicide.

[Film Forming Method]

A film forming method according to an embodiment forms a polycrystalline silicon film on a substrate. The polycrystalline silicon film can be used as a channel silicon film of a three-dimensional NAND flash memory, for example.

The film forming method according to this embodiment will be described with reference to FIG. 1A through FIG. 1D. FIG. 1A through FIG. 1D are cross sectional views illustrating the film forming method according to this embodiment.

First, as illustrated in FIG. 1A, a substrate 101 having an oxide film 102 on a surface thereof is prepared (preparation step or process). The substrate 101 is a silicon substrate, for example. The oxide film 102 is a silicon oxide film, for example. The surface of the substrate 101 may include a concave portion, such as a hole, a trench, or the like.

Figure 1B:
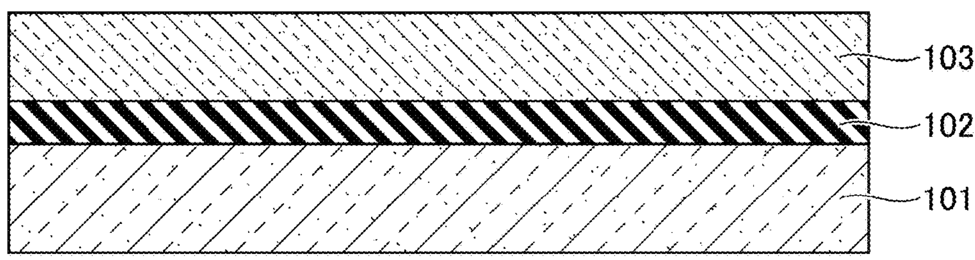

Next, as illustrated in FIG. 1B, an amorphous silicon film (or non-crystalline silicon film) 103 is formed on the oxide film 102 by chemical vapor deposition (CVD) using a silicon source gas (film forming step or process). The silicon source gas is diisopropylaminosilane (DIPAS), disilane, monosilane, or a combination thereof. A substrate temperature is in a range greater than or equal to 350° C. and less than or equal to 500° C., for example.

Figure 1C:
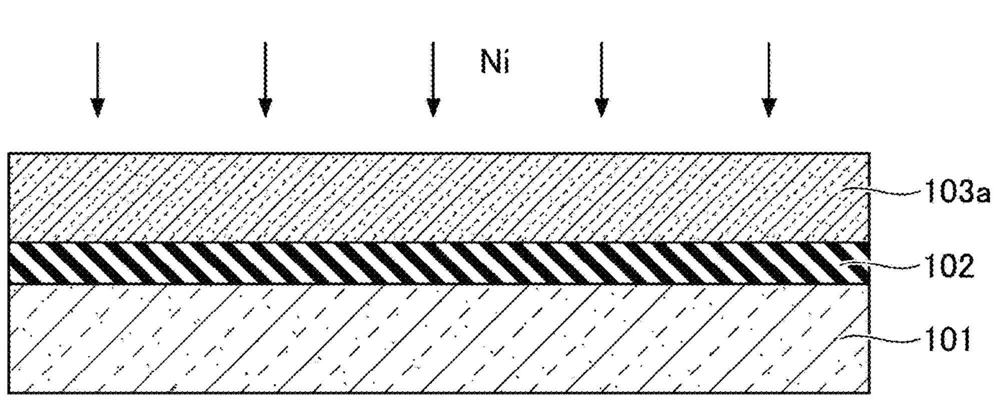

Next, as illustrated in FIG. 1C, a nickel source gas is supplied to the substrate 101, to diffuse nickel (Ni) into the amorphous silicon film 103 (diffusion step or process). As a result, an amorphous silicon film in which Ni is diffused (hereinafter referred to as a "Ni-containing amorphous silicon film 103*a*") is formed. The nickel source gas can be generated by vaporizing a liquid nickel source, for example. The liquid nickel source is $(EtCp)_2Ni[Ni(C_2H_5C_5H_4)_2]$, $NiPF_3[Ni(PF_3)_4]$, $CpAllylNi[(C_3H_5)(C_5H_5)Ni]$, or $Ni(CO)_4$, for example. The nickel source gas can be generated by sublimating a solid nickel source, for example. The solid nickel source is $(MeCp)_2Ni[Ni(CH_3C_5H_4)]$, for example. In a case where $(EtCp)_2Ni$ is used as the nickel source, for example, the substrate temperature is in a range greater than or equal to 150° C. and less than or equal to 300° C. During the diffusion step or process, an amount of Ni diffused into the Ni-containing amorphous silicon film 103*a* can be adjusted by controlling a supply amount of the nickel source gas. The diffusion step or process is continuously performed in the same processing chamber that is used to perform the film forming step or process, for example. However, the diffusion step or process may be performed in a processing chamber different from the processing chamber in which the film forming step or process is performed, for example.

Figure 1D:
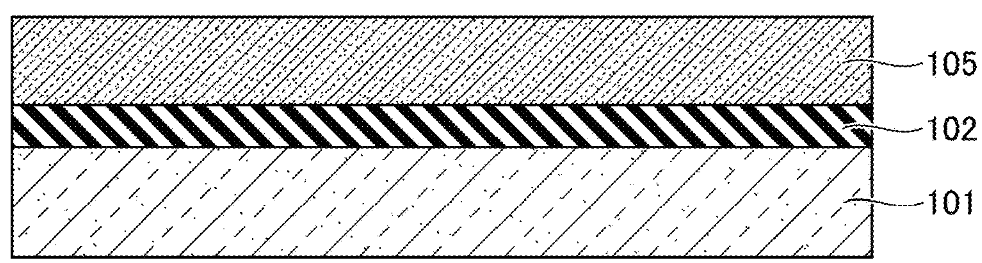

Next, as illustrated in FIG. 1D, the Ni-containing amorphous silicon film 103*a* is crystallized by metal-induced lateral crystallization (MILC), to form a polycrystalline silicon film 105 (crystallization step or process). More particularly, the substrate 101 is heated to a predetermined temperature in an inert gas atmosphere at atmospheric pressure (or ordinary pressure), and the Ni-containing amorphous silicon film 103*a* is crystallized by the metal-induced lateral crystallization using the Ni diffused in the Ni-containing amorphous silicon film 103*a* as a nucleus, to form the polycrystalline silicon film 105. The predetermined temperature is in a range greater than or equal to 500° C. and less than or equal to 600° C., for example. The crystallization step or process may be performed under a reduced pressure. The crystallization step or process is performed continuously in the same processing chamber that is used to perform the diffusion step or process, for example. However, the crystallization step or process may be performed in a processing chamber different from the processing chamber in which the film forming step or process is performed, for example.

The polycrystalline silicon film 105 can be formed on the substrate 101 by the steps or processes described above. After the crystallization step or process, Ni remaining in a surface layer of the polycrystalline silicon film 105 or in the polycrystalline silicon film 105 may be removed by gettering, for example.

As described above, according to the film forming method of the embodiment, Ni is diffused into the amorphous silicon film 103 using the nickel source gas, and the Ni-containing amorphous silicon film 103*a* is then crystallized by the metal-induced lateral crystallization, to form the polycrystalline silicon film 105. For this reason, the polycrystalline silicon film 105 can be formed by the metal-induced lateral crystallization using a low concentration of Ni. As a result, agglomeration of nickel silicide (NiSi) in the surface layer of the polycrystalline silicon film 105 can be reduced. In addition, the polycrystalline silicon film 105 having a small surface roughness and a large grain size can be formed. Further, the Ni remaining in the surface layer of the polycrystalline silicon film 105 and in the polycrystalline silicon film 105 can easily be removed by gettering.

According to the film forming method of the embodiment, Ni is diffused into the amorphous silicon film 103 using the nickel source gas. For this reason, when the Ni is diffused into the amorphous silicon film 103 formed on the inner surface of the concave portion, a variation in an amount of the Ni diffused in a depth direction of the concave portion can be reduced. As a result, the polycrystalline silicon film 105 having a small variation in the grain size in the depth direction of the concave portion can be formed.

On the other hand, in a case where Ni is physically adsorbed in the surface layer of the amorphous silicon film 103 by sputtering or coating, it is necessary to physically adsorb Ni at a high concentration in the surface layer of the amorphous silicon film 103 when the polycrystalline silicon film 105 having a large grain size is to be formed. For this reason, agglomeration of NiSi is likely to occur in the surface layer of the amorphous silicon film 103, thereby deteriorating the surface roughness and generating residue of NiSi grains that are difficult to remove. In addition, it is difficult to physically adsorb the Ni uniformly in the surface layer of the amorphous silicon film 103 in the depth direction of the concave portion.

The film forming method according to a first modification of the embodiment will be described with reference to FIG. 2A through FIG. 2E. FIG. 2A through FIG. 2E are cross sectional views illustrating the film forming method according to the first modification of the embodiment. Hereinafter, differences from the film forming method illustrated in FIG. 1A through FIG. 1D will mainly be described.

Figure 2A:
FIG. 2A, FIG. 2B, FIG. 2C, FIG. 2D, and FIG. 2E are cross sectional views illustrating the film forming method according to a first modification of the embodiment.

First, as illustrated in FIG. 2A, a substrate 201 having an oxide film 202 on a surface thereof is prepared (preparation step or process). The substrate 201 and the oxide film 202 may be similar to the substrate 101 and the oxide film 102, respectively.

Figure 2B:
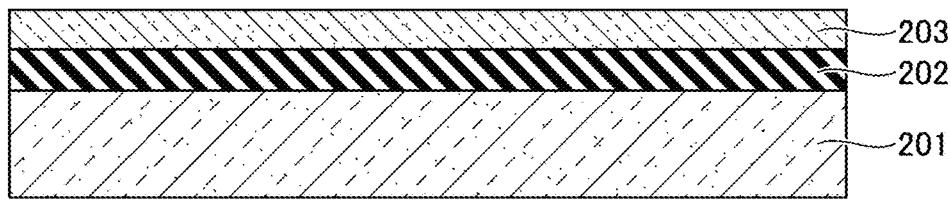

Next, as illustrated in FIG. 2B, an amorphous silicon film 203 is formed on the oxide film 202 by CVD using a silicon source gas (first film forming step or process). A thickness of the amorphous silicon film 203 may be smaller than a target thickness of the polycrystalline silicon film 205, for example. In this case, it is possible to reduce the amount of Ni diffused into the amorphous silicon film 203 in diffusion step or process which will be described later. A thickness of the amorphous silicon film 203 may be smaller than a thickness of the amorphous silicon film 103, for example.

Figure 2C:
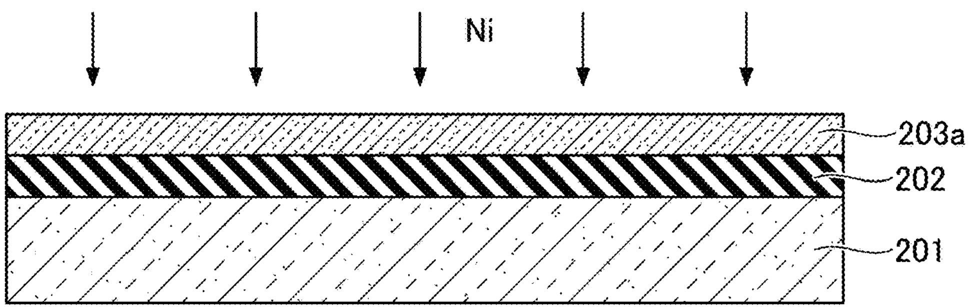

Next, as illustrated in FIG. 2C, a nickel source gas is supplied to the substrate 201, to diffuse Ni into the amorphous silicon film 203 (diffusion step or process). As a result, an amorphous silicon film in which Ni is diffused (hereinafter referred to as a "Ni-containing amorphous silicon film 203*a*") is formed.

Figure 2D:
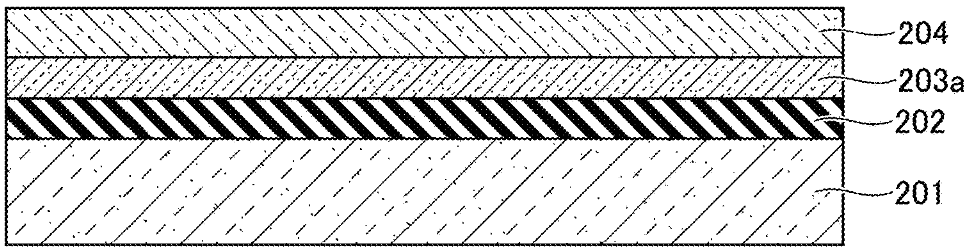

Next, as illustrated in FIG. 2D, an amorphous silicon film 204 is formed on the Ni-containing amorphous silicon film 203*a* by CVD using a silicon source gas (second film forming step or process). The silicon source gas may be the same as the silicon source gas that is used when forming the amorphous silicon film 203, for example. However, the silicon source gas may be different from the silicon source gas that is used when forming the amorphous silicon film 203, for example.

Figure 2E:
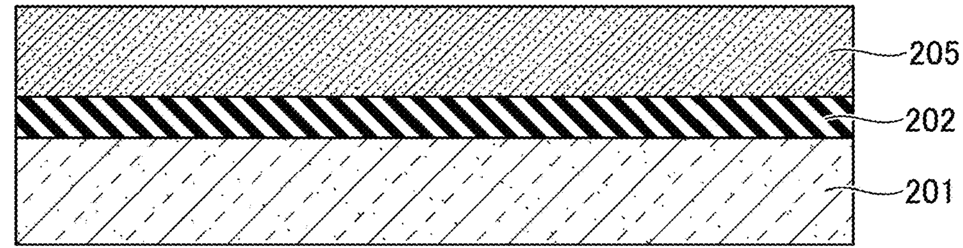

Next, as illustrated in FIG. 2E, the Ni-containing amorphous silicon film 203*a* and the amorphous silicon film 204 are crystallized by metal-induced lateral crystallization, to form a polycrystalline silicon film 205 (crystallization step or process). In the crystallization step or process, the Ni-containing amorphous silicon film 203*a* and the amorphous silicon film 204 are crystallized by metal-induced lateral crystallization using the Ni diffused in the Ni-containing amorphous silicon film 203*a* as a nucleus.

The polycrystalline silicon film 205 can be formed on the substrate 201 by the steps or processes described above. After the crystallization step or process, the Ni remaining in a surface layer of the polycrystalline silicon film 205 or in the polycrystalline silicon film 205 may be removed by gettering, for example.

As described above, according to the film forming method of the first modification of the embodiment, the Ni is diffused only in the amorphous silicon film 203. For this reason, the polycrystalline silicon film 205 can be famed by the metal-induced lateral crystallization using a lower concentration of Ni.

A film forming method according to a second modification of the embodiment will be described with reference to FIG. 3A through FIG. 3E. FIG. 3A through FIG. 3E are cross sectional views illustrating the film forming method according to the second modification of the embodiment. Hereinafter, differences from the film forming method illustrated in FIG. 1A through FIG. 1D will mainly be described.

Figure 3A:
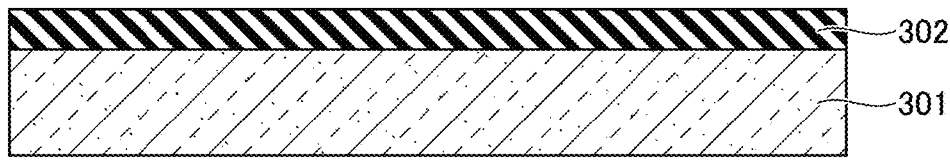
FIG. 3A, FIG. 3B, FIG. 3C, FIG. 3D, and FIG. 3E are cross sectional views illustrating the film forming method according to a second modification of the embodiment.

First, as illustrated in FIG. 3A, a substrate 301 having an oxide film 302 on a surface thereof is prepared (preparation step or process). The substrate 301 and the oxide film 302 may be similar to the substrate 101 and the oxide film 102, respectively.

Figure 3B:
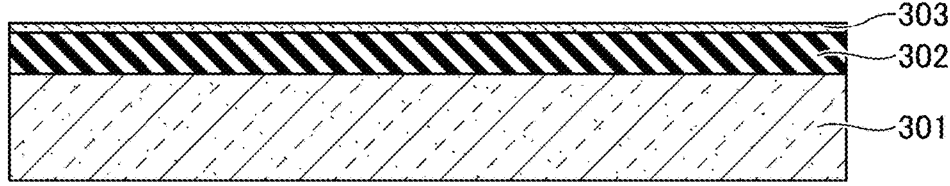

Next, as illustrated in FIG. 3B, a silicon source gas is supplied to the substrate 301, to form a seed layer 303 on the oxide film 302 (seed layer forming step or process). The seed layer 303 is a layer in which the silicon source gas is adsorbed in an island shape on the oxide film 302.

Figure 3C:
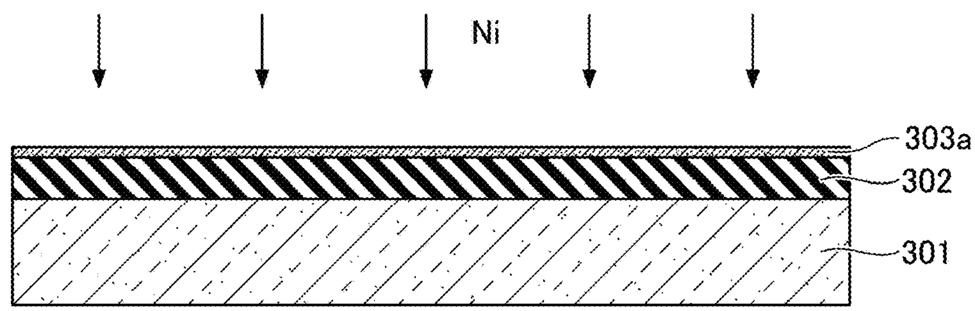

Next, as illustrated in FIG. 3C, a nickel source gas is supplied to the substrate 301, to diffuse Ni into the seed layer 303 (diffusion step or process). As a result, a seed layer in which Ni is diffused (hereinafter referred to as "Ni-containing seed layer 303*a*") is famed. Because the seed layer 303 is thin compared to the thickness of the amorphous silicon film 103, it is possible to reduce the amount of Ni diffused into the seed layer 303 in the diffusion step or process.

Figure 3D:
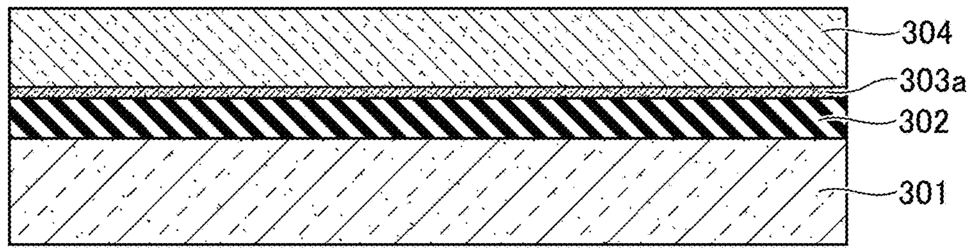

Next, as illustrated in FIG. 3D, an amorphous silicon film 304 is formed on the Ni-containing seed layer 303*a* by CVD, using a silicon source gas (film forming step or process).

Figure 3E:
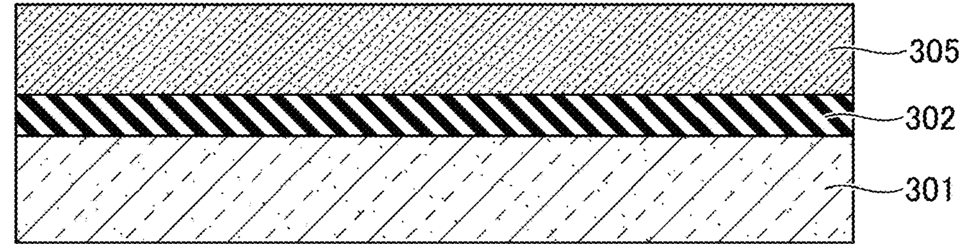

Next, as illustrated in FIG. 3E, the Ni-containing seed layer 303*a* and the amorphous silicon film 304 are crystallized by metal-induced lateral crystallization, to form a polycrystalline silicon film 305 (crystallization step or process). In the crystallization step or process, the Ni-containing seed layer 303*a* and the amorphous silicon film 304 are crystallized by metal-induced lateral crystallization, using the Ni diffused in the Ni-containing seed layer 303*a* as a nucleus.

The polycrystalline silicon film 305 can be formed on the substrate 301 by the steps or processes described above. After the crystallization step or process, the Ni remaining in a surface layer of the polycrystalline silicon film 305 or in the polycrystalline silicon film 305 may be removed by gettering, for example.

As described above, according to the film forming method of the second modification of the embodiment, the Ni is diffused only in the seed layer 303. For this reason, the polycrystalline silicon film 305 can be famed by the metal-induced lateral crystallization using a lower concentration of Ni.

[Film Forming Apparatus]

Figure 4:
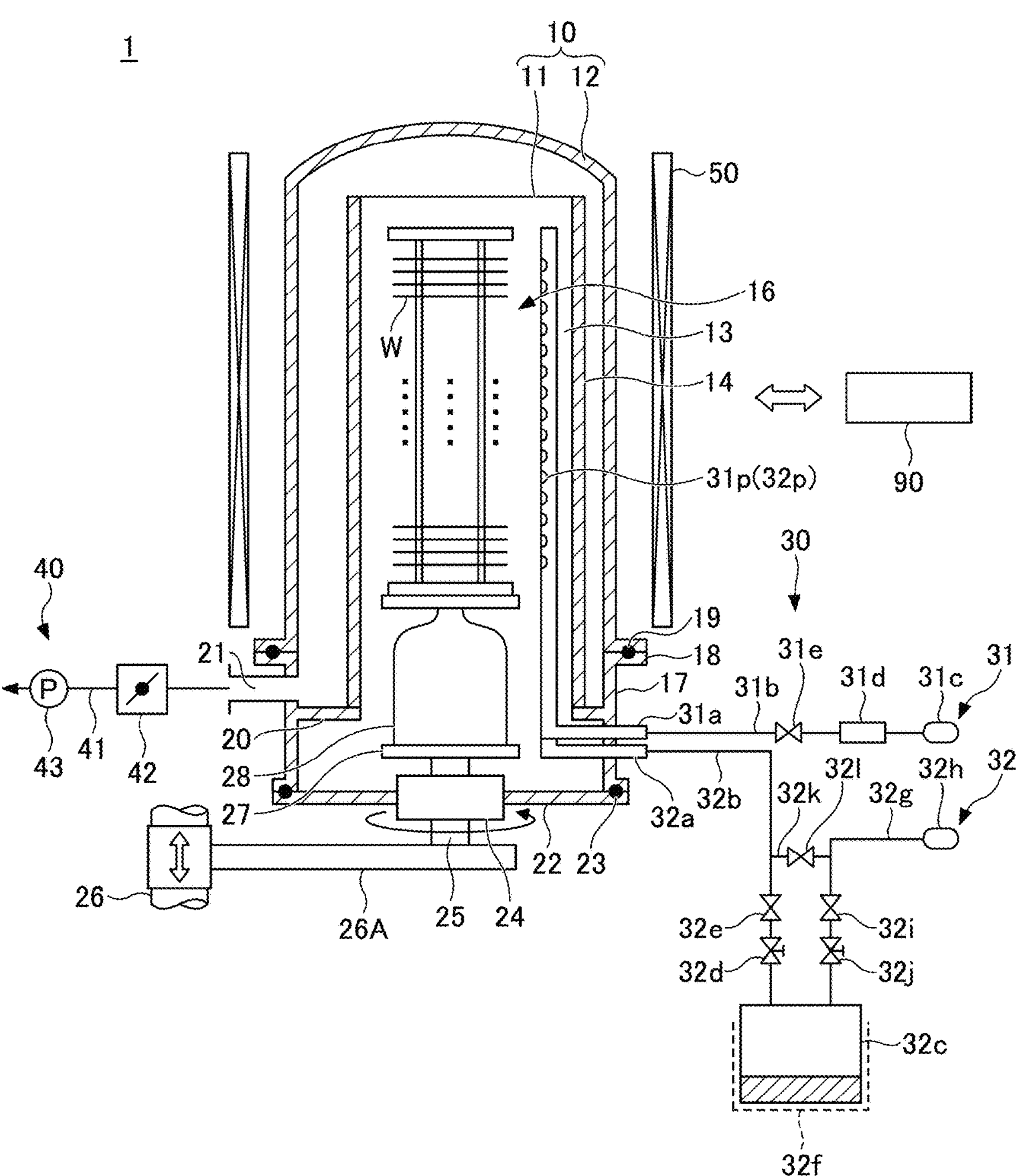
FIG. 4 is a cross sectional view illustrating a film foaming apparatus according to an embodiment.

An example of a film forming apparatus capable of performing the film forming method according to the embodiment or modification will be described with reference to FIG. 4. FIG. 4 is a cross sectional view illustrating the film forming apparatus according to the embodiment.

A film forming apparatus (or film deposition apparatus) 1 includes a processing chamber 10, a gas supply 30, an exhauster 40, a heater 50, and a controller 90.

The processing chamber 10 has a double tube structure including a cylindrical inner tube 11 and an outer tube 12 having a ceiling and concentrically disposed outside the inner tube 11. The inner tube 11 and the outer tube 12 are made of quartz, for example. The processing chamber 10 is configured to accommodate a boat 16.

An accommodating part 13 is formed on one side of the inner tube 11 along a longitudinal direction (or vertical direction) thereof. The accommodating part 13 is a region inside a convex portion 14 that is formed on a portion of a sidewall of the inner tube 11 outward so as to protrude outward. A gas supply pipe is accommodated inside the accommodating part 13.

A lower end of the processing chamber 10 is supported by a cylindrical manifold 17 formed of stainless steel, for example. A flange 18 is formed at an upper end of the manifold 17. The flange 18 supports a lower end of the outer tube 12. A seal member 19, such as an O-ring or the like, is provided between the flange 18 and the lower end of the outer tube 12.

An annular support 20 is provided on an inner wall of the manifold 17 at an upper portion thereof. The support 20 supports a lower end of the inner tube 11. An exhaust port 21 is provided in a sidewall of the manifold 17 at the upper portion thereof, at a position above the support 20. A lid 22 is airtightly attached to an opening at a lower end of the manifold 17, via a seal member 23, such as an O-ring or the like. The lid 22 is made of stainless steel, for example.

A rotating shaft 25 penetrates a central portion of the lid 22 via a magnetic fluid seal 24. A lower end of the rotating shaft 25 is rotatably supported by an aim 26A of an elevator mechanism 26 including a boat elevator. A rotation plate 27 is provided at an upper end of the rotating shaft 25. The boat 16 is placed on the rotation plate 27 via a heat insulating cylinder 28 made of quartz.

The boat 16 holds a plurality of (for example, 25 to 200) substrates W in an approximately horizontal state at intervals in the vertical direction. The substrate W is a semiconductor wafer, for example. The boat 16 rotates integrally with the rotating shaft 25. The boat 16 moves up and down integrally with the lid 22 as the arm 26A is raised and lowered, and the boat 16 is inserted into and removed from the processing chamber 10.

The gas supply 30 is configured to be able to introduce various kinds of gases used in the film forming method according to the embodiment into the inner tube 11. The gas supply 30 includes a silicon source supply 31, and a nickel source supply 32.

The silicon source supply 31 includes a silicon source supply pipe 31*a* inside the processing chamber 10, and a silicon source supply path 31*b* outside the processing chamber 10. The silicon source supply path 31*b* is provided with a silicon source 31*c*, a mass flow controller 31*d*, and a gate valve 31*e* that are arranged in this order from an upstream side toward a downstream side in a gas flow direction. Accordingly, a supply timing of the silicon source gas from the silicon source 31*c* is controlled by the gate valve 31*e*, and a flow rate of the silicon source gas is adjusted to a predetermined flow rate by the mass flow controller 31*d*. The silicon source gas flows from the silicon source supply path 31*b* into the silicon source supply pipe 31*a*, and is discharged from the silicon source supply pipe 31*a* into the processing chamber 10.

The nickel source supply 32 includes a nickel source supply pipe 32*a* inside the processing chamber 10, and a nickel source supply path 32*b* outside the processing chamber 10. The nickel source supply path 32*b* is provided with a source tank 32*c*, a regulating valve 32*d*, and a gate valve 32*e* that are arranged in this order from the upstream side toward the downstream side in the gas flow direction. The source tank 32*c* stores a nickel source. The nickel source is a source that is liquid at room temperature or a source that is solid at room temperature. A heater 32*f* is provided around the source tank 32*c*. The heater 32*f* heats the nickel source stored inside the source tank 32*c*. As a result, the liquid nickel source is vaporized, to generate a nickel source gas. Alternatively, a solid nickel source is sublimated, to generate the nickel source gas.

The nickel source supply 32 includes a carrier gas pipe 32*g* inserted from above into the source tank 32*c*. The carrier gas pipe 32*g* is provided with a carrier gas source 32*h*, a gate valve 32*i*, and a regulating valve 32*j* that are arranged in this order from the upstream side toward the downstream side in the gas flow direction. As a result, a supply timing of the carrier gas in the carrier gas source 32*h* is controlled by the gate valve 32*i*. A flow rate of the carrier gas is adjusted to a predetermined flow rate by the regulating valve 32*j*, and the carrier gas is supplied into the source tank 32*c*. The supply timing of the carrier gas is controlled by the gate valve 32*e*, together with the nickel source gas inside the source tank 32*c*. The flow rate of the carrier gas is controlled to a predetermined flow rate by the regulating valve 32*d*, and the carrier gas flows from the nickel source supply path 32*b* into the nickel source supply pipe 32*a*. The nickel source gas and the carrier gas flowing into the nickel source supply pipe 32*a* are discharged from the nickel source supply pipe 32*a* into the processing chamber 10. A bypass path (or channel) 32*k* may be provided to connect the upstream side of the gate valve 32*i* in the carrier gas pipe 32*g* and the downstream side of the gate valve 32*e* in the nickel source supply path 32*b*, and a bypass valve 32*l* may be provided in the bypass path 32*k*.

Each of the gas supply pipes (the silicon source supply pipe 31*a* and the nickel source supply pipe 32*a*) is fixed to the manifold 17. Each gas supply pipe is made of quartz, for example. Each gas supply pipe extends linearly in the vertical direction at a position near the inner tube 11, and bends in an L-shape inside the manifold 17 to extend in the horizontal direction, so as to penetrate the manifold 17. The gas supply pipes are provided side by side along a circumferential direction of the inner tube 11, and are famed to the same height. A plurality of gas holes 31*p* are provided in a portion of the silicon source supply pipe 31*a* located inside the inner tube 11. A plurality of gas holes 32*p* are provided in a portion of the nickel source supply pipe 32*a* located inside the inner tube 11. The gas holes 31*p* are formed at predetermined intervals along a direction in which the silicon source supply pipe 31*a* extends, and the gas holes 32*p* are formed at predetermined intervals along a direction in which the nickel source supply pipe 32*a* extends. Each gas hole discharges the gas in the horizontal direction. The interval between the gas holes is set the same as the interval between the substrates W held on the boat 16. The position of each gas hole in a height direction is set to an intermediate position between the substrates W that are adjacent to each other in the vertical direction. Accordingly, each gas hole can efficiently supply the gas to the mutually opposing surfaces of the adjacent substrates W.

The gas supply 30 may mix a plurality of kinds of gases and discharge a gas mixture from one supply pipe. For example, the silicon source supply pipe 31*a* and the nickel source supply pipe 32*a* may be configured to discharge an inert gas. The gas supply pipes (the silicon source supply pipe 31*a* and the nickel source supply pipe 32*a*) may have mutually different shapes or arrangements. The gas supply 30 may further include a gas supply pipe configured to supply another gas in addition to the silicon source gas and the nickel source gas.

The exhauster 40 includes an exhaust passage 41 connected to the exhaust port 21. The exhaust passage 41 is provided with a pressure regulating valve 42 and a vacuum pump 43 that are arranged in this order from the upstream side toward the downstream side in the gas flow direction. Accordingly, the exhaust flow rate of the gas inside the processing chamber 10 is controlled by the pressure regulating valve 42, and the gas is exhausted to the outside of the processing chamber 10 by the vacuum pump 43.

The heater 50 has a cylindrical shape, and is provided around the outer tube 12. The heater 50 includes a heating element, for example, and heats the substrates W inside the processing chamber 10.

The controller 90 performs the film forming method according to the embodiment, for example, by controlling the operation of each of the components of the film forming apparatus 1. The controller 90 may be a computer, for example. The computer may include a processor and a storage medium, for example. The storage medium may store a program which, when executed by the computer (or processor), causes the computer to perform an operation of each of the components of the film forming apparatus 1. The storage medium may be a non-transitory computer-readable storage medium, such as a floppy disk, a compact disk, a hard disk, a flash memory, a digital versatile disk (DVD), or the like, for example.

[Operation of Film Forming Apparatus]

An operation of the film forming apparatus 1 when performing the film forming method according to the embodiment will be described.

First, the controller 90 controls the elevator mechanism 26 to load the boat 16 holding the plurality of substrates W into the processing chamber 10, and airtightly close and seal the opening at the lower end of the processing chamber 10 by the lid 22. Each of the substrates W is the substrate 101 having the oxide film 102 on the surface thereof, for example.

Next, the controller 90 controls the gas supply 30, the exhauster 40, and the heater 50, so as to perform the film forming step or process described above. More particularly, the controller 90 first controls the exhauster 40 to reduce the pressure inside the processing chamber 10 to a predetermined pressure, and controls the heater 50 to control and maintain the temperature of the substrates W to a predetermined temperature. Next, the controller 90 controls the silicon source supply 31 to supply the silicon source gas into the processing chamber 10. Thus, the amorphous silicon film 103 is formed (or deposited) on the oxide film 102.

Next, the controller 90 controls the gas supply 30, the exhauster 40, and the heater 50, so as to perform the diffusion step or process described above. More particularly, the controller 90 first controls the exhauster 40 to reduce the pressure inside the processing chamber 10 to a predetermined pressure, and controls the heater 50 to control and maintain the temperature of the substrates W to a predetermined temperature. Next, the controller 90 controls the nickel source supply 32 to supply the nickel source gas into the processing chamber 10. As a result, nickel diffuses into the amorphous silicon film 103, thereby forming the Ni-containing amorphous silicon film 103*a*.

Next, the controller 90 controls the gas supply 30, the exhauster 40, and the heater 50, so as to perform the crystallization step or process described above. More particularly, the controller 90 first controls the gas supply 30 to supply an inert gas into the processing chamber 10, controls the exhauster 40 to control the pressure inside the processing chamber 10 to a predetermined pressure, and controls the heater 50 to control and maintain the temperature of the substrates W to a predetermined temperature. Thus, the Ni-containing amorphous silicon film 103*a* is crystallized by the metal-induced lateral crystallization, thereby forming the polycrystalline silicon film 105.

Next, the controller 90 increases the pressure inside the processing chamber 10 to the atmospheric pressure, lowers the temperature inside the processing chamber 10 to an unloading temperature, and then controls the elevator mechanism 26 to unload the boat 16 inside the processing chamber 10 to the outside of the processing chamber 10.

[Exemplary Implementations]

In an exemplary implementation 1, a silicon substrate having an oxide film on a surface thereof was prepared, the prepared silicon substrate was accommodated inside the processing chamber 10 of the film forming apparatus 1 described above, and a polycrystalline silicon film was formed on the oxide film under the following conditions 1A through 1C. Next, the grain size and the Ni concentration of the polycrystalline silicon film were measured. The grain size was measured by a transmission electron microscope (TEM) electron diffraction mapping (TEM ED-Map). The Ni concentration was measured by total reflection X-ray fluorescence (TXRF).

(Condition 1A)

Under the condition 1A, the film forming step or process, the diffusing step or process, and the crystallization step or process of the film forming method according to the embodiment described above were continuously performed in this order, to form the polycrystalline silicon film. In the film forming step or process, an amorphous silicon film having a thickness of 19 nm was formed. In the diffusion step or process, a gas obtained by vaporizing $(EtCp)_2Ni$ was supplied at a low concentration, as the nickel source gas. In the crystallization step or process, the silicon substrate was heated to a temperature of 550° C.

(Condition 1B)

Under the condition 1B, the nickel source gas was supplied in the diffusion step or process at a higher concentration than under the condition 1A. Other conditions were the same as the condition 1A.

(Condition 1C)

Under condition 1C, no diffusion step or process was performed. Other conditions were the same as the condition 1A.

FIG. 5 is a diagram comparing crystal grain maps of polycrystalline silicon films. As illustrated in FIG. 5, under the condition 1A, an arithmetic average of grain diameter (or grain size) was 1.23 μm, a weighted average of grain diameter was 6.80 μm, and an in-film Ni concentration was $4.7\times10^{12}$ atoms/cm$^2$. Under the condition 1B, the arithmetic average of the grain diameter was 1.07 μm, the weighted average of the grain diameter was 2.26 μm, and the in-film Ni concentration was $1.3\times10^{14}$ atoms/cm$^2$. Under the condition 1C, the arithmetic average of the grain diameter was 0.66 μm, and the weighted average of the grain diameter was 0.76 μm. It was confirmed from these results that a polycrystalline silicon film having a large grain size can be formed by performing the diffusion step or process. It was also confirmed that a polycrystalline silicon film having a large grain size can be famed by lowering the in-film Ni concentration in the case where the diffusion step or process is performed.

In an exemplary implementation 2, a silicon substrate having an oxide film on a surface thereof was prepared, the prepared silicon substrate was accommodated inside the processing chamber 10 of the film forming apparatus 1 described above, and a polycrystalline silicon film was formed on the oxide film under the following conditions 2A through 2C. Next, the grain size and the Ni concentration of the polycrystalline silicon film were measured. The grain size was measured by the TEM electron diffraction mapping. The Ni concentration was measured by the total reflection X-ray fluorescence analysis.

(Condition 2A)

The condition 2A was the same as the condition 1A described above.

(Condition 2B)

Under the condition 2B, Ni was physically adsorbed in the surface layer of the amorphous silicon film by coating a Ni-containing liquid, instead of performing the diffusion step or process. Other conditions were the same as the condition 1A.

(Condition 2C)

Under the condition 2C, Ni was physically adsorbed in the surface layer of the amorphous silicon film by sputtering using a Ni target, instead of performing the diffusion step or process. Other conditions were the same as the condition 1A.

Figure 6:
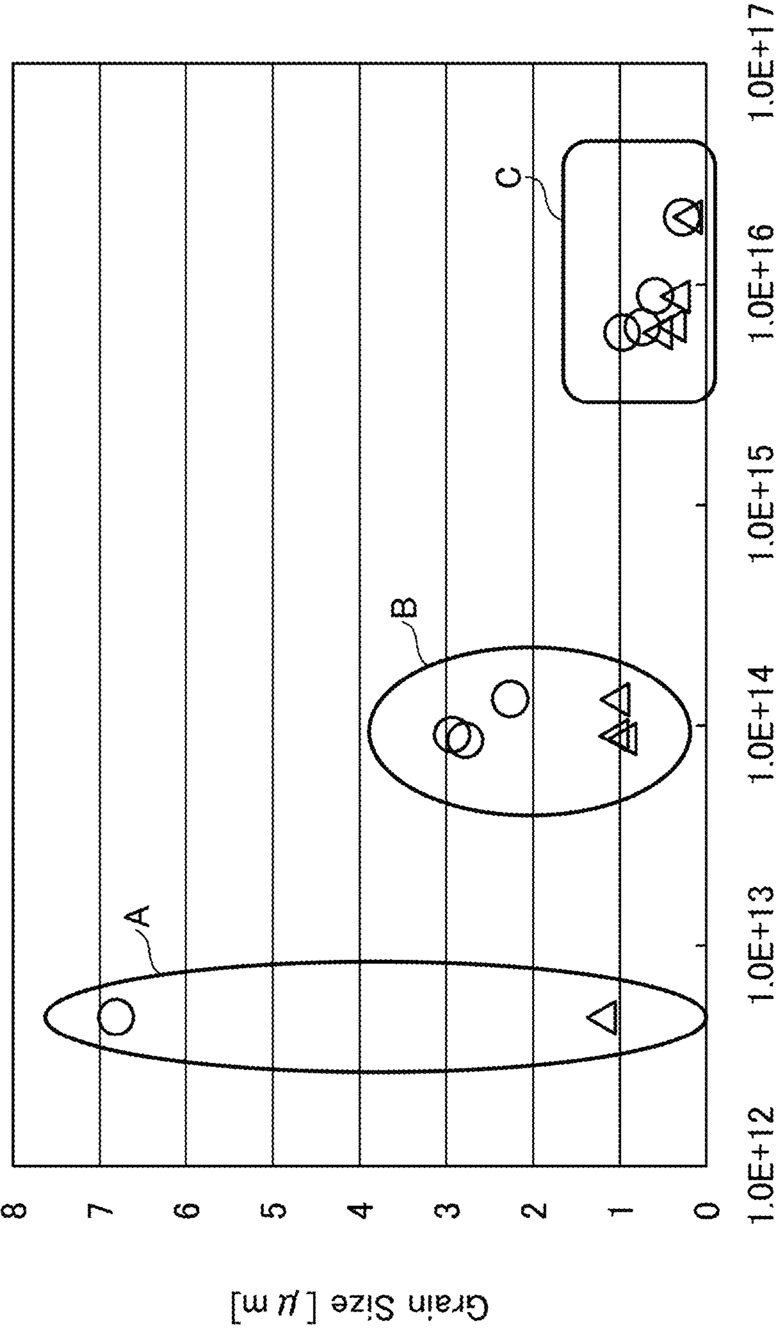
FIG. 6 is a diagram illustrating results of measuring a relationship between a grain size and a Ni concentration of the polycrystalline silicon film.

FIG. 6 is a diagram illustrating results of measuring a relationship between the grain size (or grain diameter) and the Ni concentration of the polycrystalline silicon film. In FIG. 6, the ordinate indicates the grain size [μm] of the polycrystalline silicon film, and the abscissa indicates the Ni concentration [atoms/cm$^2$] of the polycrystalline silicon film. In FIG. 6, the results included in a region A indicate the results for the polycrystalline silicon film formed under the condition 2A, the results included in a region B indicate the results for the polycrystalline silicon film formed under the condition 2B, and the results included in a region C indicate the results for the polycrystalline silicon film formed under the condition 2C. In FIG. 6, a circular symbol "○" indicates an electron back-scatter diffraction (EBSD) weighted average grain size, and a triangular symbol "Δ" indicates an EBSD arithmetic average grain size.

As illustrated in FIG. 6, under the condition 2A, the Ni concentration is in a range of approximately 1.0×12 atoms/cm$^2$ to approximately $1.0\times10^{13}$ atoms/cm$^2$, the EBSD weighted average grain size is approximately 7 μm, and the EBSD arithmetic average grain size is approximately 1 μm. Under the condition 2B, the Ni concentration is approximately $1.0\times10^{14}$ atoms/cm$^2$, the EBSD weighted average grain size is in a range of approximately 2 μm to approximately 3 μm, and the EBSD arithmetic average grain size is approximately 1 μm. Under the condition 2C, the Ni concentration is approximately $1.0\times10^{16}$ atoms/cm$^2$, and the EBSD weighted average grain size and the EBSD arithmetic average grain size are in a range greater than 0 μm to approximately 1 μm. It was confirmed from these results that a polycrystalline silicon film having a low Ni concentration and a large grain size can be formed, by diffusing Ni into the amorphous silicon film using the nickel source gas, when compared to the case where Ni is physically adsorbed in the surface layer of the amorphous silicon film.

In an exemplary implementation 3, a silicon substrate having an oxide film on a surface thereof was prepared, the prepared silicon substrate was accommodated inside the processing chamber 10 of the film forming apparatus 1 described above, and a polycrystalline silicon film was formed on the oxide film under the following conditions 3A through 3B. Next, the polycrystalline silicon film was observed using a transmission electron microscope (TEM).

(Condition 3A)

The condition 3A was the same as the condition 1A described above.

(Condition 3B)

The condition 3B was the same as the condition 1B described above.

(Condition 3C)

The condition 3C was the same as the condition 2C described above.

According to the observation results obtained using the TEM, agglomeration of NiSi was not observed on the surfaces of the polycrystalline silicon films formed under the conditions 3A and 3B, but agglomeration of NiSi was observed on the surface of the polycrystalline silicon film famed under the condition 3C. From these results, it was confirmed that the agglomeration of NiSi can be reduced by diffusing Ni into the amorphous silicon film using the nickel source gas.

In an exemplary implementation 4, a silicon substrate having an oxide film on a surface thereof was prepared, the prepared silicon substrate was accommodated inside the processing chamber 10 of the film forming apparatus 1 described above, and a polycrystalline silicon film was formed on the oxide film under the following conditions 4A and 4B. Next, the polycrystalline silicon film was analyzed by an X-ray absorption fine structure (XAFS).

(Condition 4A)

Under the condition 4A, the film forming step or process, the diffusing step or process, and the crystallization step or process of the film forming method according to the embodiment described above were continuously performed in this order, to form a polycrystalline silicon film. In the film forming step or process, an amorphous silicon film having a thickness of 19 nm was formed. In the diffusion step or process, a gas obtained by vaporizing $(EtCp)_2Ni$ was supplied, as a nickel source gas, to diffuse Ni into the amorphous silicon film, thereby forming a Ni-containing amorphous silicon film. The Ni concentration in the Ni-containing amorphous silicon film was $7.74\times10^{14}$ atoms/$cm^2$. In the crystallization step or process, the silicon substrate was heated for 240 minutes at a temperature of 575° C. in a nitrogen ($N_2$) gas atmosphere at a pressure of 700 Pa, to crystallize the Ni-containing amorphous silicon film and form a polycrystalline silicon film.

(Condition 4B)

Under the condition 4B, after the film forming step or process and before the diffusion step or process, a process of removing the oxide film on the amorphous silicon film was performed. Other conditions were the same as the condition 4A.

In the analysis by the XAFS, an L3-edge X-ray absorption near edge structure (XANES) spectrum of Ni was measured by partial electron yield (PEY), total electron yield (TEY), and fluorescence yield (FLY). Information of different depth ranges can be acquired using the PEY, the TEY, and the FLY. A detection depth of the PEY is up to several nm, the detection depth of the TEY is up to several tens of nm, and the detection depth of the FLY is up to several hundreds of nm from the surface of the polycrystalline silicon film, respectively.

Figure 7:
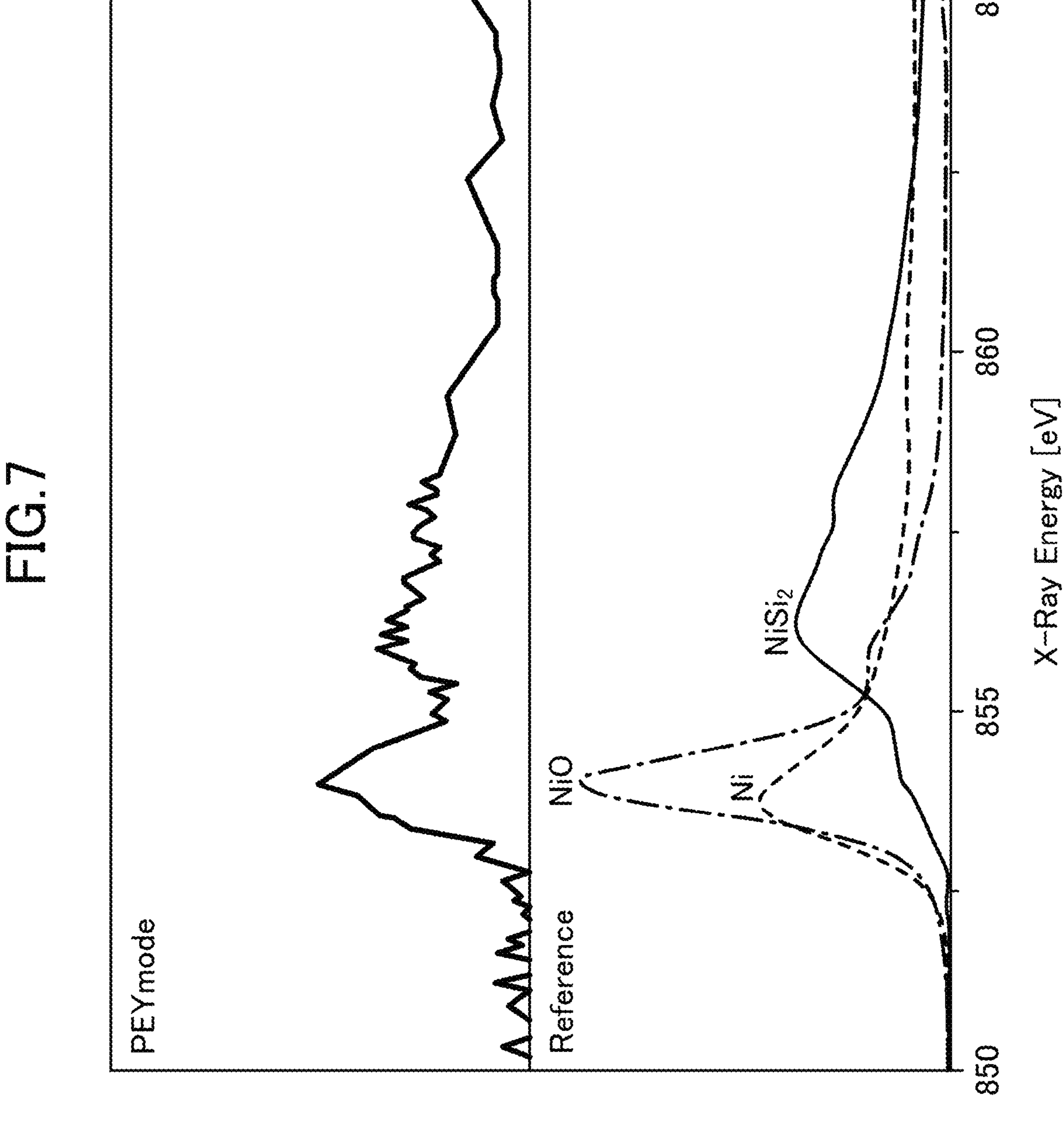
FIG. 7 is a diagram (part 1) illustrating an X-ray absorption near edge structure (XANES) spectrum of the polycrystalline silicon film formed under a condition 4A.
Figure 8:
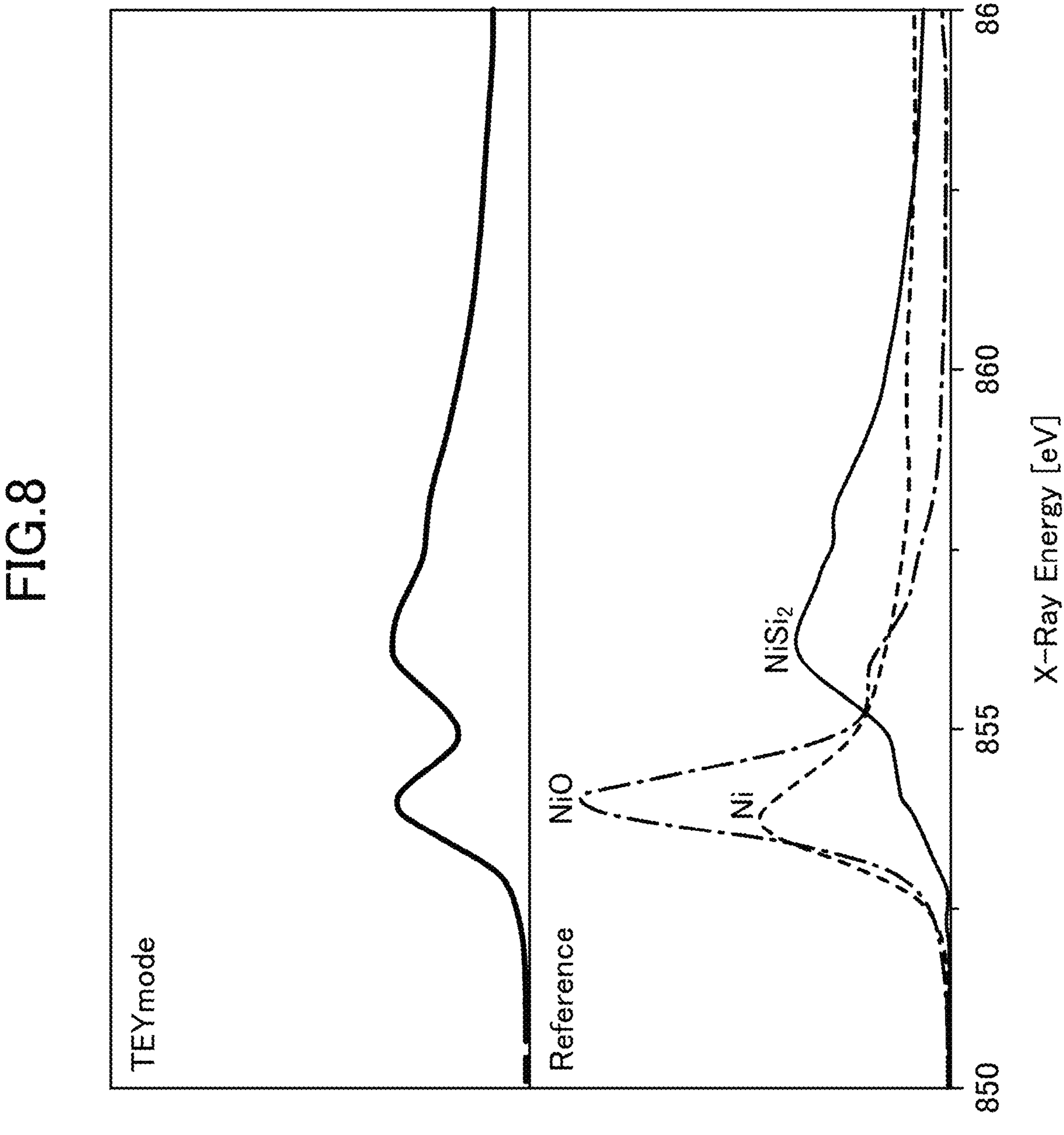
FIG. 8 is a diagram (part 2) illustrating the XANES spectrum of the polycrystalline silicon film famed under the condition 4A.
Figure 9:
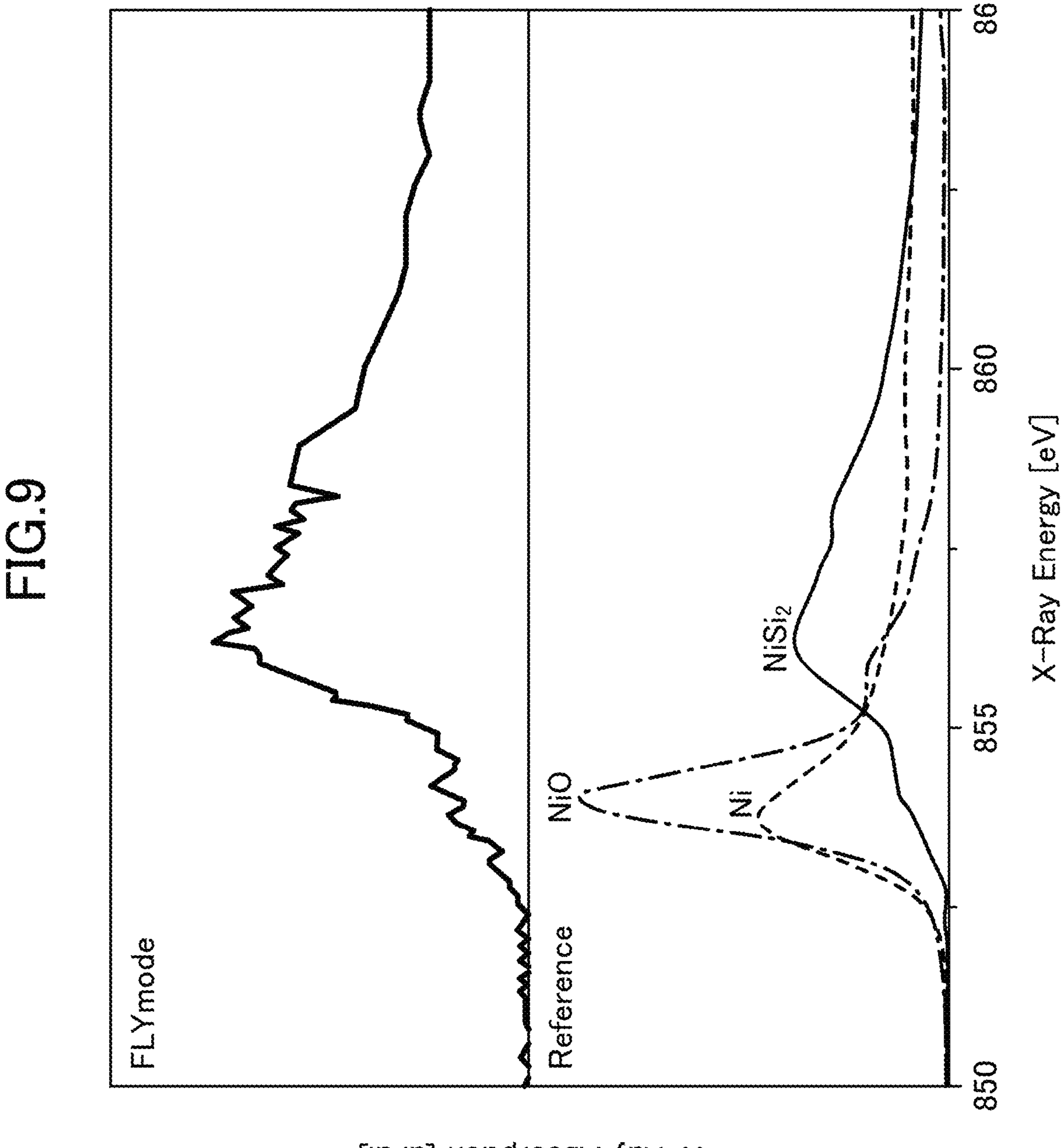
FIG. 9 is a diagram (part 3) illustrating the XANES spectrum of the polycrystalline silicon film famed under the condition 4A.

FIG. 7 through FIG. 9 are diagrams illustrating XANES spectra of the polycrystalline silicon film formed under the condition 4A. FIG. 7 illustrates the XANES spectrum measured using the PEY. FIG. 8 illustrates the XANES spectrum measured using the TEY. FIG. 9 illustrates the XANES spectrum measured using the FLY. In FIG. 7 through FIG. 9, the upper parts illustrate the measured values of the XANES spectra of the polycrystalline silicon film, and the lower parts illustrate the XANES spectra of Ni, NiO, and $NiSi_2$ acquired from a database. In FIG. 7 through FIG. 9, the abscissa indicates an X-ray energy [eV], and the ordinate indicates an X-ray absorption in arbitrary units [a. u.].

As illustrated in the upper parts of FIG. 7 through FIG. 9, it can be seen that there are differences in the XANES spectra of the polycrystalline silicon films among the cases where the PEY, the TEY, and the FLY are used. As illustrated in the upper parts of FIG. 7 and FIG. 8, a peak near 854 eV is observed in the cases where the PEY and the TEY are used, while a peak near 854 eV is not observed in the case where the FLY is used. The peak near 854 eV observed in the case where the PEY is used is higher than the peak near 854 eV observed in the case where the FEY is used. As illustrated in the lower parts of FIG. 7 through FIG. 9, the peak near 854 eV is NiO-derived. From these results, it can be estimated that NiO is present in a depth range up to several tens of nm from the surface of the polycrystalline silicon film, and that a large amount of NiO is present particularly in a depth range up to several nm from the surface of the polycrystalline silicon film.

As illustrated in the upper parts of FIG. 7 through FIG. 9, the peak is observed near 856 eV in the case where any one of the PEY, the TEY, and the FLY is used. The peak near 856 eV in the case where the FLY is used is higher than the peak near 856 eV in the cases where the PEY and the TEY are used. As illustrated in the lower parts of FIG. 7 through FIG. 9, the peak near 856 eV is $NiSi_2$-derived. These results suggest that almost all of the silicide components in a deep portion of the surface the polycrystalline silicon film were modified to $NiSi_2$, and it can be estimated that this is effective in increasing a film forming efficiency of the polycrystalline silicon film by the metal-induced lateral crystallization.

As a result of analyzing the XANES spectrum in the case where the PEY is used, it was found that an abundance ratio of Ni is 17%, the abundance ratio of NiO is 32%, and the abundance ratio of $NiSi_2$ is 51%. As a result of analyzing the XANES spectrum in the case where the TEY is used, it was found that the abundance ratio of Ni is 22%, the abundance ratio of NiO is 15%, and the abundance ratio of $NiSi_2$ is 62%. As a result of analyzing the XANES spectrum in the case where the FLY is used, it was found that the abundance ratio of Ni is 9% and the abundance ratio of $NiSi_2$ is 91%.

Figure 10:
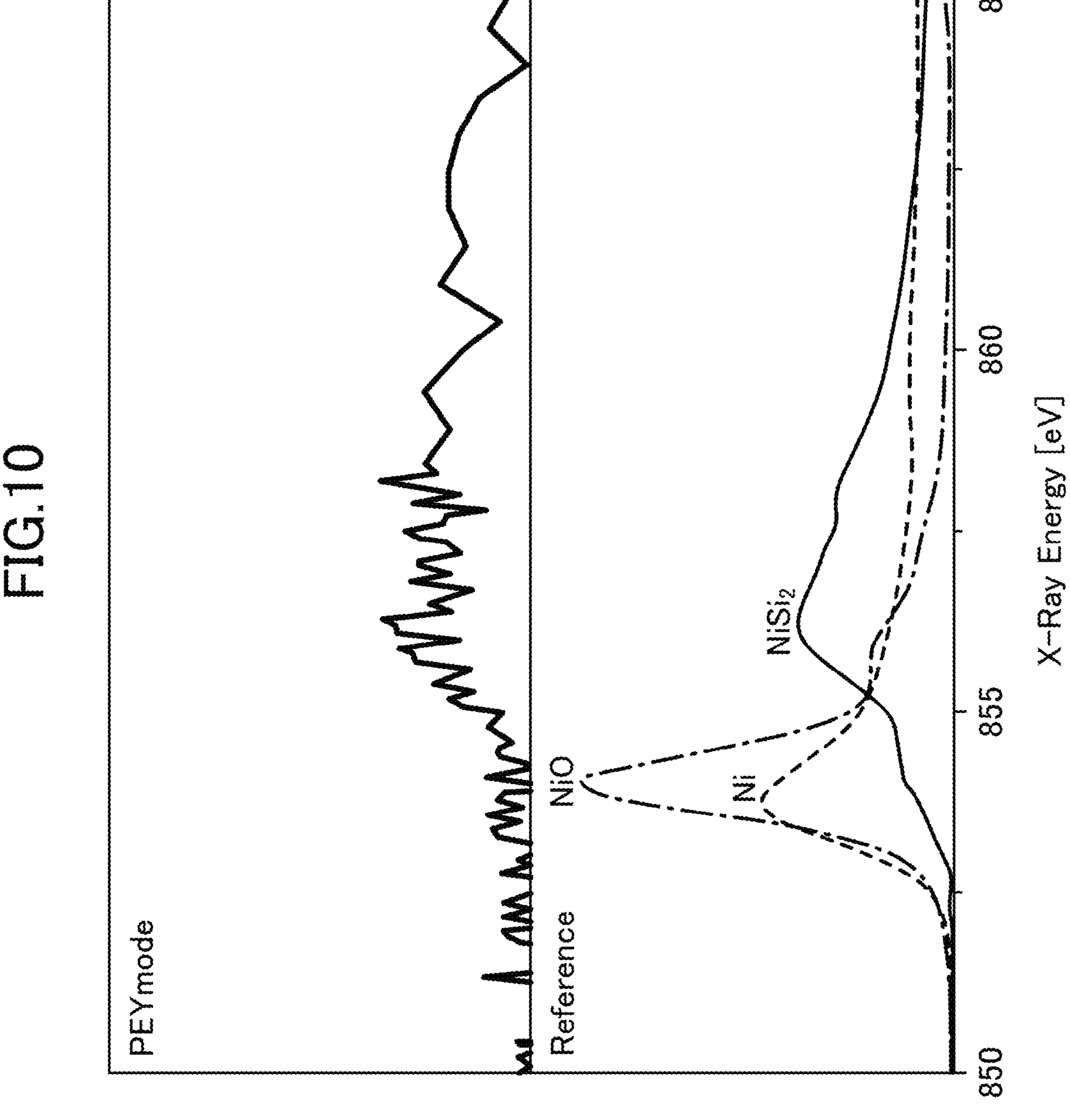
FIG. 10 is a diagram (part 1) illustrating an XANES spectrum of the polycrystalline silicon film formed under a condition 4B.
Figure 11:
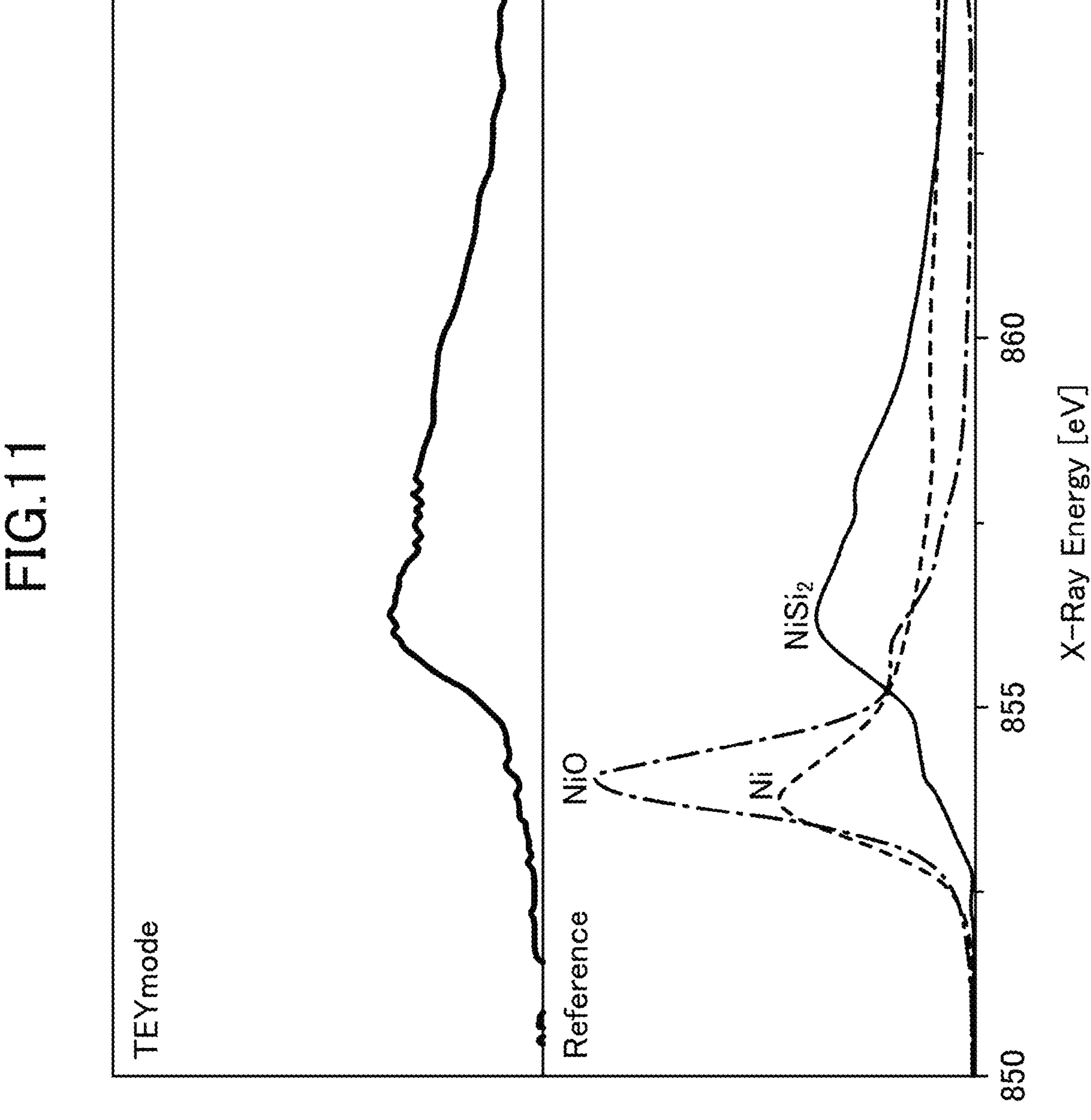
FIG. 11 is a diagram (part 2) illustrating the XANES spectrum of the polycrystalline silicon film famed under the condition 4B.
Figure 12:
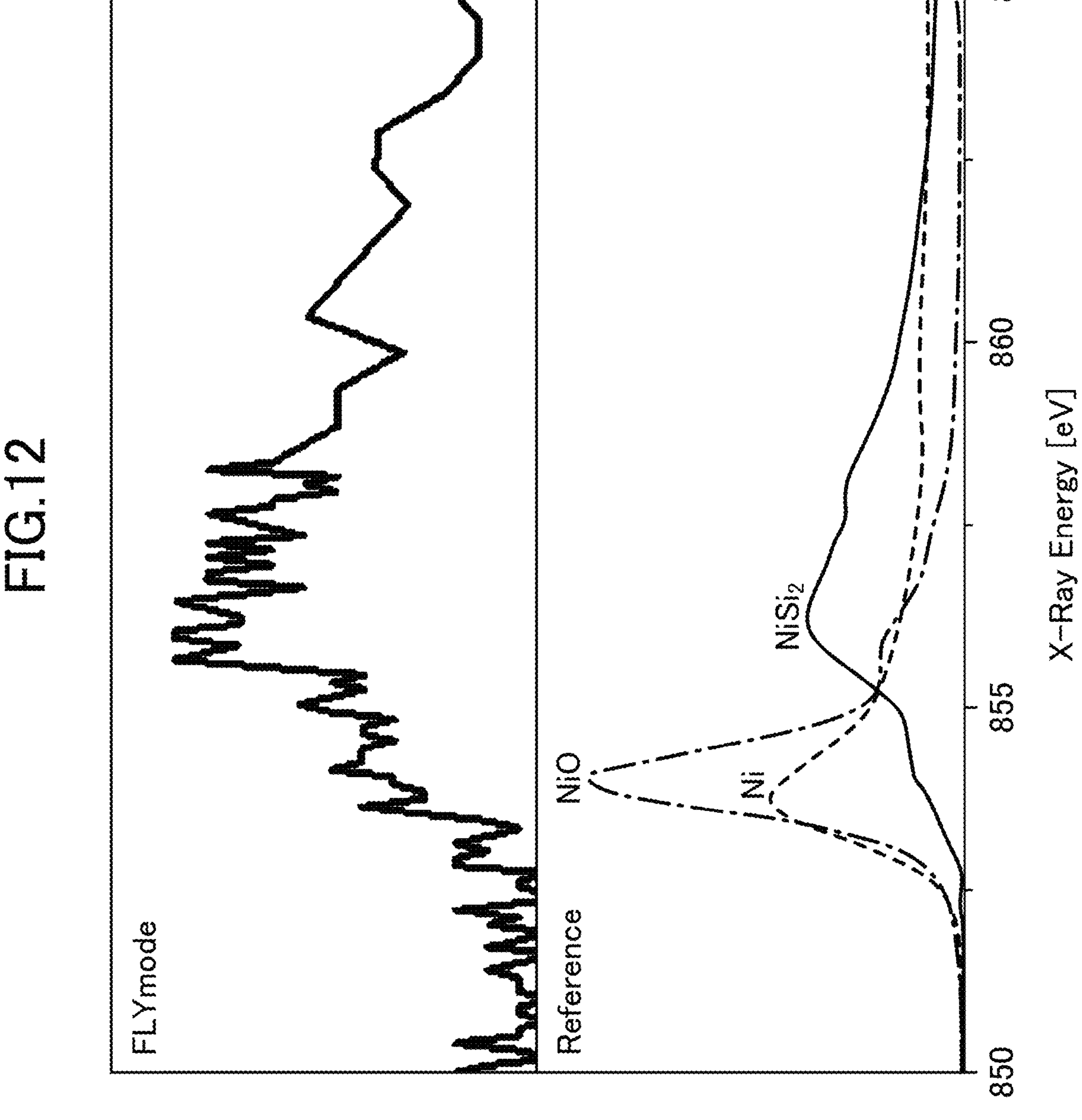
FIG. 12 is a diagram (part 3) illustrating the XANES spectrum of the polycrystalline silicon film formed under the condition 4B.

FIG. 10 through FIG. 12 are diagrams illustrating XANES spectra of polycrystalline silicon films formed under the condition 4B. FIG. 10 is an XANES spectrum measured using the PEY. FIG. 11 is an XANES spectrum measured using the TEY. FIG. 12 is a XANES spectrum measured using the FLY. In FIG. 10 through FIG. 12, the upper parts illustrate the measured values of the XANES spectra of the polycrystalline silicon film, and the lower parts illustrate the XANES spectra of Ni, NiO, and $NiSi_2$ obtained from the database. In FIG. 10 through FIG. 12, the abscissa indicates the X-ray energy [eV], and the ordinate indicates the X-ray absorption in arbitrary units [a. u.].

As illustrated in the upper parts of FIG. 10 through FIG. 12, a peak near 856 eV is observed in the case where any one of the PEY, the TEY, and the FLY is used. As illustrated in the lower parts of FIG. 10 through FIG. 12, the peak near 856 eV is $NiSi_2$-derived. From these results, it can be estimated that $NiSi_2$ exists in the entire depth range of the polycrystalline silicon film. That is, it can be estimated that, by removing the oxide film on the amorphous silicon film after the film forming step or process and before the diffusion step or process, $NiSi_2$ can be formed in the entire depth range of the polycrystalline silicon film.

As a result of analyzing the XANES spectrum in the case where the PEY is used, it was found that the abundance ratio of Ni is 3%, and the abundance ratio of $NiSi_2$ is 97%. As a result of analyzing the XANES spectrum in the case where the TEY is used, it was found that the abundance ratio of Ni is 1%, and the abundance ratio of $NiSi_2$ is 99%. As a result of analyzing the XANES spectrum in the case where the FLY is used, it was found that the abundance ratio of Ni is 10%, and the abundance ratio of $NiSi_2$ is 90%. From these results, it can be estimated that NiO is absent (that is, does not exist) in the polycrystalline silicon film. NiO generates a surface trap state that reduces electron mobility. The absence of NiO is advantageous from a viewpoint of obtaining high electron mobility, for example, when the polycrystalline silicon film is used as a channel silicon film of a three-dimensional NAND flash memory, for example.

In an exemplary implementation 5, a silicon substrate having an oxide film on a surface thereof was prepared, the prepared silicon substrate was accommodated inside the processing chamber 10 of the film forming apparatus 1 described above, and a polycrystalline silicon film was formed on the oxide film under the following conditions 5A and 5B. Next, the polycrystalline silicon film was analyzed, using tunneling atomic force microscopy (tunneling AFM, or TUNA).

(Condition 5A)

The condition 5A was the same as the condition 4A described above.

(Condition 5B)

The condition 5B was the same as the condition 4B described above.

According to the analysis by the TUNA, Ni included in the surface layer of the polycrystalline silicon film increases a weak leakage current, while $NiSi_2$ included in the surface layer of the polycrystalline silicon film hardly contributes to the increase of the weak leakage current. For this reason, by comparing the weak leakage currents among different polycrystalline silicon films, the abundance ratios of Ni and $NiSi_2$ in the surface layers of the polycrystalline silicon films can be relatively compared among the different polycrystalline silicon films.

Figure 13:
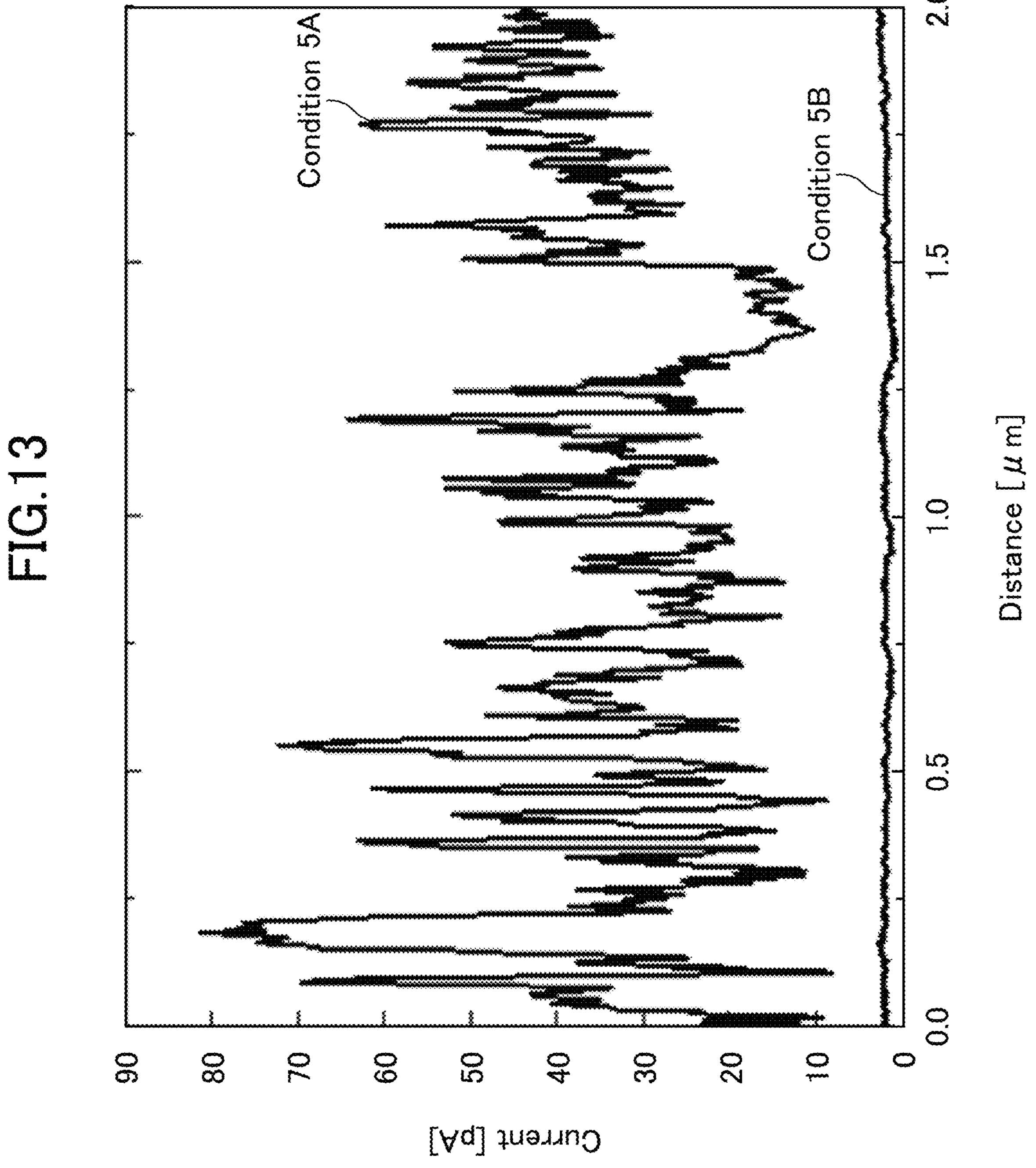
FIG. 13 is a diagram illustrating measurement results of the polycrystalline silicon films formed under conditions 5A and 5B, using tunneling atomic force microscopy (tunneling AFM, or TUNA).

FIG. 13 is a diagram illustrating measurement results of the polycrystalline silicon films formed under the conditions 5A and 5B, using the TUNA. In FIG. 13, the abscissa indicates a distance [μm] in a direction along a principal surface of the silicon substrate, and the ordinate indicates a weak leakage current [pA] that is measured when a bias is applied to the polycrystalline silicon film.

As illustrated in FIG. 13, it can be seen that the weak leakage current of the polycrystalline silicon film famed under the condition 5B is small compared to the weak leakage current of the polycrystalline silicon film famed under the condition 5A. From these results, it can be estimated that, by removing the oxide film on the amorphous silicon film after the film forming step or process and before the diffusion step or process, the abundance ratio of $NiSi_2$ in the surface layer of the polycrystalline silicon film can be increased.

According to each of the embodiments and modifications, it is possible to reduce agglomeration of nickel silicide.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

Although the film forming apparatus in the embodiment described above is a batch-type apparatus that simultaneously processes a plurality of substrates, the present disclosure is not limited thereto. For example, the film forming apparatus may be a single wafer type apparatus that processes one substrate at a time.

What is claimed is:

1. A film forming method comprising:

preparing a substrate having an amorphous silicon film on a surface thereof;

diffusing nickel into the amorphous silicon film by supplying a nickel source gas to the amorphous silicon film; and forming a polycrystalline silicon film by heating the amorphous silicon film, and crystallizing the amorphous silicon film by metal-induced lateral crystallization using the nickel diffused in the amorphous silicon film as a nucleus.

2. The film forming method as claimed in claim 1, wherein the diffusing the nickel includes generating the nickel source gas by vaporizing a liquid nickel source or sublimating a solid nickel source.

3. The film forming method as claimed in claim 2, wherein the nickel source is $Ni(C_2H_5C_5H_4)_2$, $Ni(PF_3)_4$, $(C_3H_5)(C_5H_5)Ni$, $Ni(CO)_4$, or $Ni(CH_3C_5H_4)_2$.

4. The film forming method as claimed in claim 1, wherein the surface of the substrate includes a concave portion, and preparing the substrate includes forming the amorphous silicon film on an inner surface of the concave portion.

5. The film forming method as claimed in claim 1, wherein the preparing the substrate includes forming the amorphous silicon film on the surface of the substrate in a processing chamber that is also used by the diffusing the nickel.

6. The film forming method as claimed in claim 1, wherein the diffusing the nickel is performed in a processing chamber that is also used by the forming the polycrystalline silicon film.

7. A film forming apparatus comprising:

a processing chamber configured to accommodate a substrate having an amorphous silicon film on a surface thereof;

a nickel source supply configured to vaporize a liquid nickel source or sublimate a solid nickel source to generate a nickel source gas, and supply the nickel source gas to the amorphous silicon film on the substrate accommodated inside the processing chamber to diffuse nickel into the amorphous silicon film; and a heater configured to heat the amorphous silicon film on the substrate accommodated inside the processing chamber, and form a polycrystalline silicon film by crystallizing the amorphous silicon film by metal-induced lateral crystallization using the nickel diffused in the amorphous silicon film as a nucleus.

8. The film forming apparatus as claimed in claim 7, wherein the nickel source gas is $Ni(C_2H_5C_5H_4)_2$, $Ni(PF_3)_4$, $(C_3H_5)(C_5H_5)Ni$, $Ni(CO)_4$, or $Ni(CH_3C_5H_4)_2$.

9. The film forming apparatus as claimed in claim 7, wherein the liquid nickel source is $(EtCp)_2Ni[Ni(C_2H_5C_5H_4)_2]$, $NiPF_3[Ni(PF_3)_4]$, $CpAllylNi[(C_3H_5)(C_5H_5)Ni]$, or $Ni(CO)_4$.

10. The film forming apparatus as claimed in claim 7, wherein the solid nickel source is $(MeCp)_2Ni[Ni(CH_3CH_4)]$.

11. The film forming method as claimed in claim 1, further comprising:

vaporizing a liquid nickel source to generate the nickel source gas, wherein the liquid nickel source is $(EtCp)_2Ni[Ni(C_2H_5C_5H_4)_2]$, $NiPF_3[Ni(PF_3)_4]$, $CpAllylNi[(C_3H_5)(C_5H_5)Ni]$, or $Ni(CO)_4$.

12. The film forming method as claimed in claim 1, further comprising:

sublimating a solid nickel source to generate the nickel source gas, wherein the solid nickel source is $(MeCp)_2Ni[Ni(CH_3C_5H_4)]$.

* * * * *